(12) United States Patent
Mauder et al.

(10) Patent No.: US 8,273,622 B2
(45) Date of Patent: Sep. 25, 2012

(54) SEMICONDUCTOR WITH A DYNAMIC GATE-DRAIN CAPACITANCE

(75) Inventors: Anton Mauder, Kolbermoor (DE); Hans-Joachim Schulze, Taufkirchen (DE); Carolin Tolksdorf, Steinhoering (DE); Winfried Kaindl, Unterhaching (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/161,050

(22) Filed: Jun. 15, 2011

(65) Prior Publication Data

US 2011/0244646 A1 Oct. 6, 2011

Related U.S. Application Data

(62) Division of application No. 12/184,819, filed on Aug. 1, 2008, now Pat. No. 7,982,253.

(51) Int. Cl.
*H01L 29/94* (2006.01)
(52) U.S. Cl. ......... 438/239; 257/E29.345; 257/E21.616; 257/330; 257/320; 257/332
(58) Field of Classification Search .................. 438/239; 257/E29.345, E21.616, 330, 331, 332, 333, 257/238
See application file for complete search history.

(56) References Cited

U.S. PATENT DOCUMENTS

| | | | |
|---|---|---|---|
| 4,754,310 A | 6/1988 | Coe | |
| 5,438,215 A | 8/1995 | Tihanyi | |
| 5,973,361 A | 10/1999 | Hshieh et al. | |
| 6,455,892 B1 * | 9/2002 | Okuno et al. | 257/328 |
| 6,630,698 B1 | 10/2003 | Deboy et al. | |
| 6,639,272 B2 | 10/2003 | Ahlers et al. | |
| 6,700,156 B2 | 3/2004 | Saitoh et al. | |
| 6,838,729 B2 | 1/2005 | Schloegl et al. | |
| 6,870,220 B2 | 3/2005 | Kocon et al. | |
| 2004/0113200 A1 * | 6/2004 | Kobayashi et al. | 257/328 |
| 2006/0118879 A1 | 6/2006 | Li | |

FOREIGN PATENT DOCUMENTS

| | | |
|---|---|---|
| DE | 4309764 C2 | 1/1997 |
| DE | 10120656 C2 | 7/2003 |
| DE | 19947020 B4 | 2/2006 |
| JP | 2004-006598 | 1/2004 |

OTHER PUBLICATIONS

Office Action mailed Jun. 16, 2010 relative to U.S. Appl. No. 12/184,819.
Final Office Action mailed Dec. 7, 2010 relative to U.S. Appl. No. 12/184,819.
Notice of Allowance mailed Mar. 17, 2011 relative to U.S. Appl. No. 12/184,819.

* cited by examiner

*Primary Examiner* — Marc Armand
(74) *Attorney, Agent, or Firm* — Dicke, Billig & Czaja, PLLC

(57) ABSTRACT

A semiconductor device with a dynamic gate drain capacitance. One embodiment provides a semiconductor device. The device includes a semiconductor substrate, a field effect transistor structure including a source region, a first body region, a drain region, a gate electrode structure and a gate insulating layer. The gate insulating layer is arranged between the gate electrode structure and the body region. The gate electrode structure and the drain region partially form a capacitor structure including a gate-drain capacitance configured to dynamically change with varying reverse voltages applied between the source and drain regions. The gate-drain capacitance includes at least one local maximum at a given threshold or a plateau-like course at given reverse voltage.

9 Claims, 12 Drawing Sheets

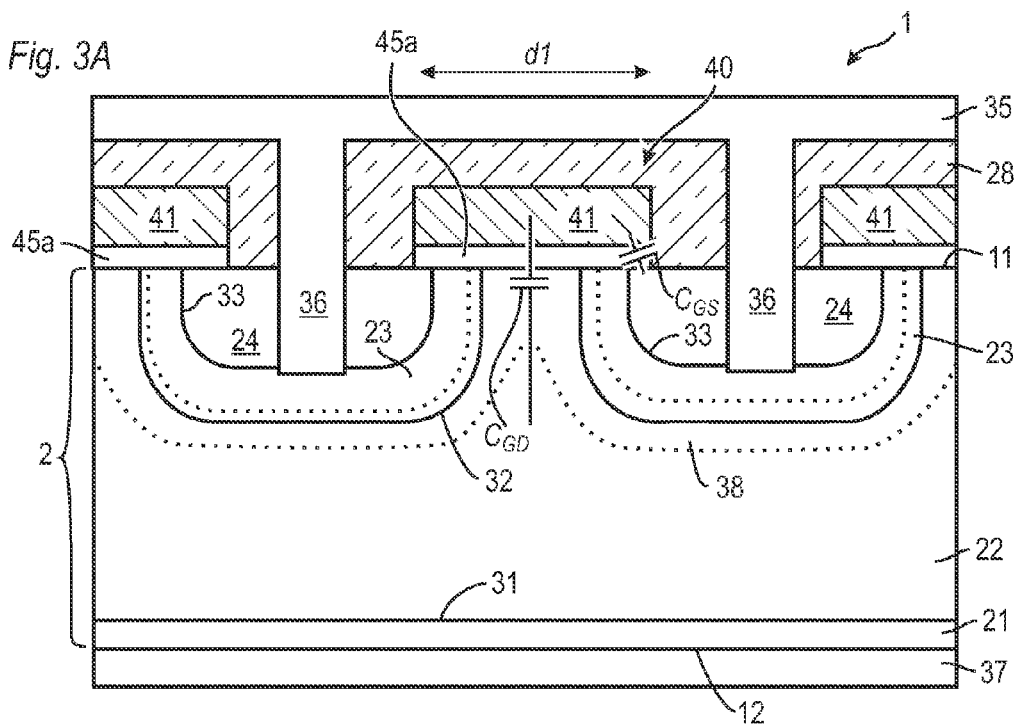
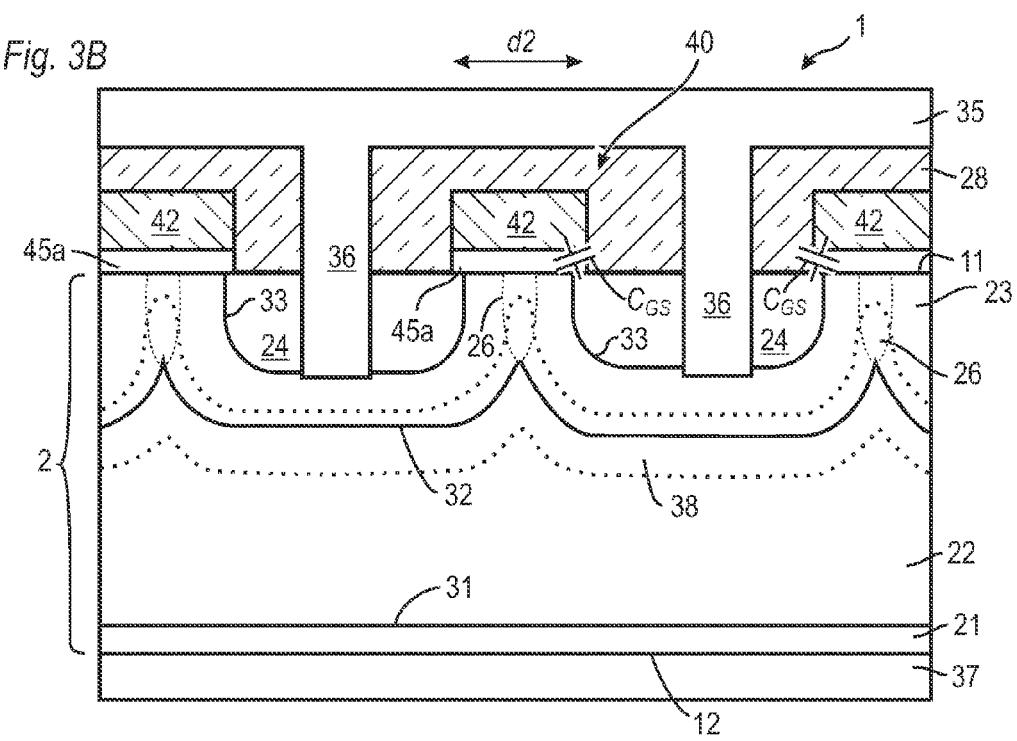

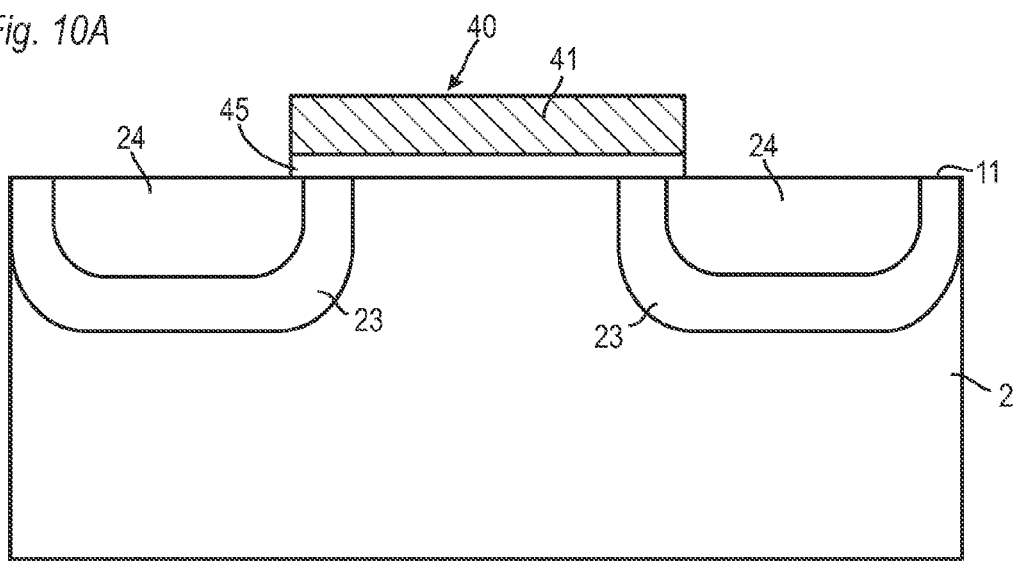
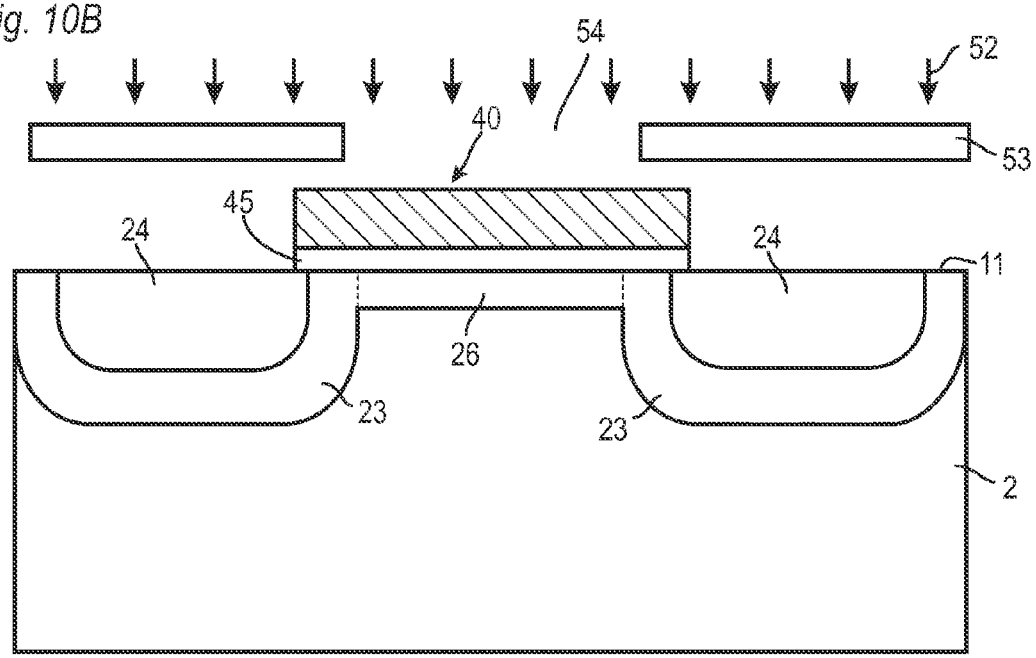

SEMICONDUCTOR WITH A DYNAMIC GATE-DRAIN CAPACITANCE

CROSS-REFERENCE TO RELATED APPLICATIONS

This Utility patent application is a divisional application of U.S. application Ser. No. 12/184,819, filed Aug. 1, 2008, which is incorporated herein by reference.

BACKGROUND

This specification refers to embodiments of semiconductor devices having a body region and a depletable region which adjoins the body region, and a method for manufacturing a semiconductor device. In one or more embodiments, the present specification pertains to power semiconductor devices such as unipolar devices, for example, field effect devices, having an electrode structure arranged next to a body region and a depletable region.

Unipolar devices such as MOSFETs are used in switching applications, such as, for example, switching power supplies. MOSFETs are suited to such switching applications due to their relatively high switching speed and low control power requirements. However, they exhibit dynamic losses which represent a large percentage of the total losses in many applications. The dynamic losses are directly proportional to the device rise and fall times which are, in turn, proportional to the gate-drain capacitance, i.e. the Miller capacitance, of the device ($C_{GD}$ or $Q_{GD}$).

As illustrated in FIG. 12, the Miller capacitance of a MOSFET also results in a "flat" region in the gate curve of conventional MOSFETs. This flat region, referred to as Miller region, is representative of the device transitioning from a blocking state to a conducting state or from a conducting state to a blocking state. In FIG. 12, a transition from a blocking to a conductive state is illustrated. The dashed line represent the case that the drain-source voltage $U_{DS}$ is zero.

In the Miller region most of the switching losses occur since the device current and voltage are high. In addition to the switching losses, the Miller capacitance may also contribute to significant oscillations in the gate and load circuits during switching which could adversely affect the device performance and could even lead to a destruction of the device. Adjusting the Miller capacitance is therefore an ongoing desire.

For reducing the switching losses, the area over which the gate and drain regions overlap could be reduced. Different thereto, an increase of the Miller capacitance might be desired to reduce the slope of the voltage increase or decrease to damp excitation of oscillations during switching. Another approach would be to increase the internal gate resistance by changing the layout design of the gate electrode structure. Increasing the internal gate resistance leads, however, to higher switching losses. Furthermore, by changing the layout design, the initial capacitances $C_{GS}$ and $C_{GD}$ and hence the gate charge is changed which affects the losses in the respective drive circuits.

For these and other reasons, there is a need for the present invention.

SUMMARY

According to one embodiment, a semiconductor device is provided. The semiconductor device includes a semiconductor substrate having a surface, a drift region of a first conductivity type, at least a first body region of a second conductivity type, at least a source region of the first conductivity type, and at least a depletable region of the second conductivity type. The depletable region adjoins the first body region and forms a pn-junction with the drift region. The first body region is arranged between the drift region and the source region and forms respective pn-junctions therewith. At least an electrode structure is arranged on the surface of the semiconductor substrate and electrically insulated therefrom. The electrode structure is arranged at least in portions next to the first body region and at least in portions next to the depletable region.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A and 3B illustrate the extent of the depletion zone for different cross-sectional views at low reverse voltage.

FIGS. 10A and 10B illustrate processes of a manufacturing method according to one embodiment.

DETAILED DESCRIPTION

Figure 1A:
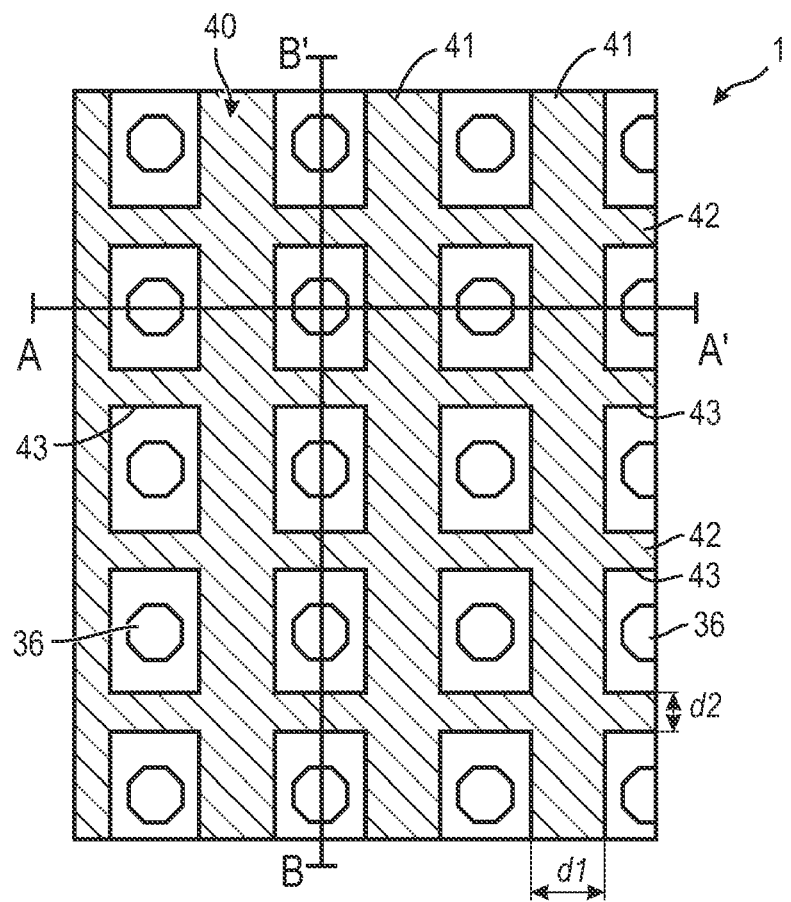
FIG. 1A illustrates one embodiment of a semiconductor device including the layout of an electrode structure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The term "lateral" as used in this specification intends to describe an orientation parallel to the main surface of a semiconductor substrate.

The term "vertical" as used in this specification intends to describe an orientation which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of the orientation defined by the first (upper) and second (lower) surface.

Specific embodiments described in this specification pertain to, without being limited thereto, unipolar power semiconductor devices and particularly to devices which are controlled by field-effect such as MOSFETs and devices having compensation structures such as CoolMOS.

In this specification, n-doped is referred to as first conductivity type while p-doped is referred to as second conductivity type. It goes without saying that the semiconductor devices can be formed with opposite doping relations so that the first conductivity type can be p-doped and the second conductivity type can be n-doped. Furthermore, the Figures illustrate relative doping concentrations by indicating "–" or "+" next to the doping type. For example, "n$^-$" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an n+ and a p+ region.

In the context of the present specification, the term "depletable region" intends to describe that this region is substantially completely depleted during reverse state of the semiconductor device above a given threshold. To this end, the doping charge of the depletable region is appropriately adjusted, and in one or more embodiments the depletable region is a weakly doped region. The depletable region is arranged at the main surface and forms a pp$^-$- or nn$^-$-junction with the body region since the body region and the depletable region have are of the same doping type. Furthermore, the depletable region forms a separate pn-junction to the drift region which is different than the pn-junction between body and drift region. The purpose of the depletable region is the increase of the space-charge region at the main surface next to the electrode structure.

Figure 2A:
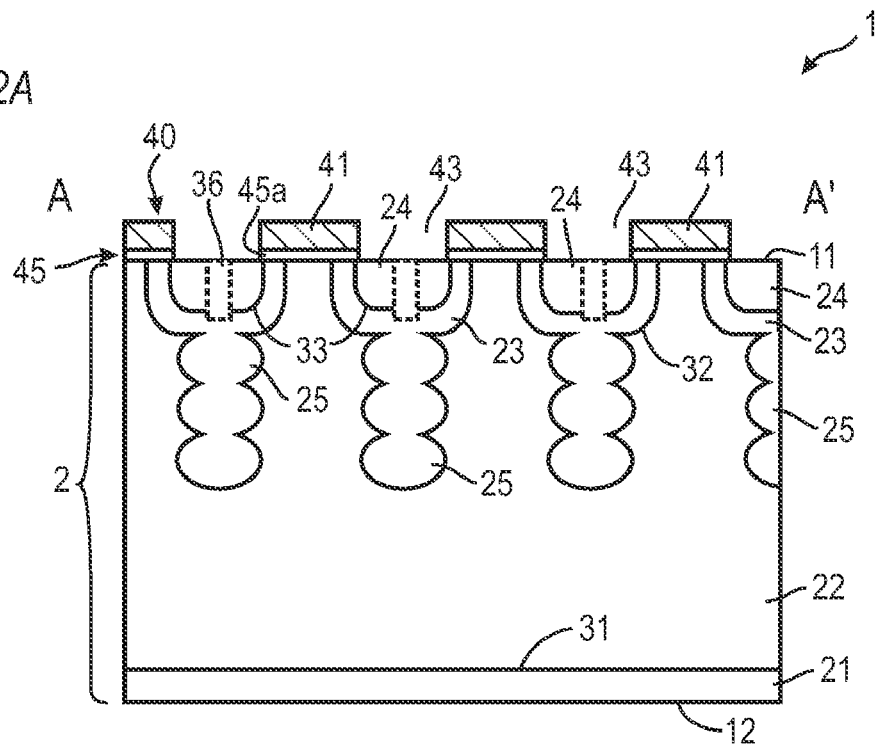
FIGS. 2A and 2B illustrate cross-sectional views along lines AA' and BB' in FIG. 1A.
Figure 2B:
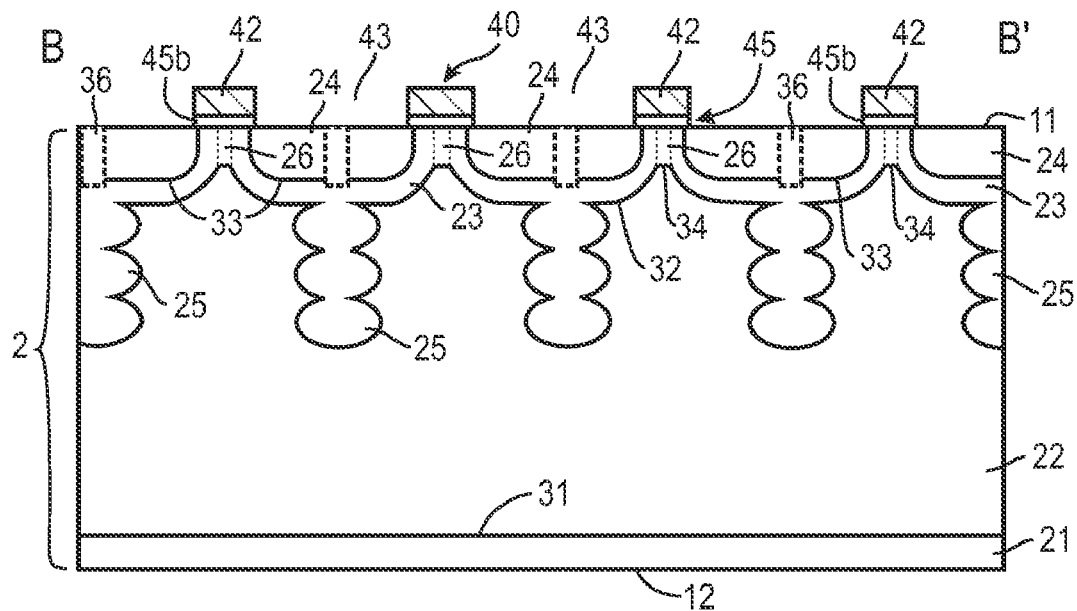

With reference to FIGS. 1A, 2A and 2B, one embodiment of a semiconductor device is described. The semiconductor device 1 includes a semiconductor substrate 2 having a first or upper surface 11 and a second or lower surface 12 arranged opposite to the first surface 11. The semiconductor substrate 2 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC materials are used.

The semiconductor substrate 2 can be a single bulk monocrystalline material. It is also possible, that the semiconductor substrate 2 includes a bulk mono-crystalline material and at least one epitaxial layer formed thereon. In one embodiment, epitaxial layers provides more freedom in tailoring the background doping of the material since the doping concentration can be adjusted during deposition of the epitaxial layer or layers.

FIG. 1A illustrates a plan view of a portion of semiconductor device 1. A plurality of cells is formed in the semiconductor device 1. FIG. 1A illustrates an electrode structure 40 having first electrode portions 41 and second electrode portions 42. First electrode portions 41 are formed by stripes or bars running parallel to line BB' while the second electrode portions 42 are formed by stripes or bars running parallel to line AA' in FIG. 1A. The width d1 of the first electrode portions 41 is larger than the width d2 of the second electrode portions 42. As it becomes more apparent from FIGS. 2A and 2B, first electrode portions 41 serve as gate electrodes while second electrode portions 42 serve as capacitor electrodes for dynamically changing the gate-drain-capacitance of the device 1.

In one or more embodiments, the electrode structure 40 can include a plurality of first bars 41 each forming a gate electrode portion and a plurality of second bars 42 each forming a switch electrode portion, wherein the first bars 41 run perpendicular to the second bars 42 when seen in a plan view on the first surface.

The first or gate electrode portions 41 are arranged to control and switch the load current flowing through the semiconductor device 1. The second or switch electrode portions 42 function as structures having a dynamically changing capacitance as described in detail further below.

Regular openings 43 are formed in the electrode structure 40 to expose the respective source regions of each cell. Plugs 36 provide electrical contact to the source and body regions as it becomes more apparent from FIGS. 3A and 3B, for example. Plugs 36 are illustrated in FIGS. 2A and 2B as phantoms.

The semiconductor substrate 2 further includes a drain region 21 of the first conductivity type. In this embodiment, drain region 21 is highly n-doped. In contact with drain region 21, a drift region 22 of the first conductivity type, also referred to as voltage sustaining region, is formed. Drift region 22 is a weakly n-doped region and forms an nn$^+$-junction 31 to drain region 21. In other embodiments, a field stop region of the first conductivity type having a higher doping concentration than the drift region 22 but a lower doping concentration than the drain region 21 can be formed between the drift region 22 and the drain region 21. In some embodiments, the drift region 22 can have a doping concentration in a range from about $5*10^{13}/cm^3$ to about $5*10^{16}/cm^3$ depending on the required blocking voltage. For devices having compensation regions as described further below the doping concentration can be in a range from about $5*10^{14}/cm^3$ to about $5*10^{16}/cm^3$ while devices, which do not include compensation regions, the doping concentration is often in a range from about $5*10^{13}/cm^3$ to about $5*10^{15}/cm^3$. In further embodiments, the drain region 21 can have a doping concentration in a range from about $5*10^{17}/cm^3$ and higher. It should be mentioned here that the doping concentrations given in this description refer to the peak doping concentration unless otherwise stated since the doping regions typically do not have a constant doping level.

A body region 23 of the second conductivity type, which is in this embodiment of the p-type, is formed on and in contact with the drift region 22. Thereby a first pn-junction 32 is formed. In some embodiments, the body region 23 can have a typical doping concentration from about $1*10^{16}/cm^3$ up to about $10^{18}/cm^3$ and higher. The doping concentration of the body region 23 typically drops towards the pn-junction formed with the drift region 22 to reach there a doping concentration which can be similar to that of the drift region 22. As illustrated in FIGS. 2A and 2B, a respective highly n-doped source region 24 is embedded in each body regions 23. In some embodiments, source region or regions 24 can have a doping concentration in a range from about $5*10^{18}/cm^3$ to about $1*10^{21}/cm^3$. Second pn-junctions 33 are formed between the source region 24 and the respective body region 23.

To reduce the on-state resistance of the device, the doping concentration of the drift region 22 can be increased by up to about one order of magnitude or above when compensation regions 25 of the second conductivity type are arranged below the body regions 23. A respective compensation region 25 can be assigned to and adjoins each body region 23. The compensation regions 25 may have a columnar shape and illustrated here to be formed by a plurality of overlapping doping regions arranged at different depth. The surplus of the n-doping of the drift region 22 is compensated during reverse state by the oppositely doped compensation regions 25. In one or more embodiments, the compensation regions 25 can have a typical peak doping concentration up to about $5*10^{17}/cm^3$ and drops towards the pn-junction formed with the drift region 22.

Typically, the semiconductor substrate 2 is formed by providing a single bulk mono-crystalline body on which one or more single-crystalline layers are depositing epitaxially. The epitaxial layer or layers accommodates or accommodate the drift region 22, body region 23 and source region or regions 24. During epitaxial deposition, the desired doping concentration of the drift region 22 can be adjusted by supplying an appropriate amount of dopant. In one embodiment, the epitaxial deposition can be interrupted to conduct intermediate implantation processes. Different thereto, the body region 23 and the source region or regions 24 are typically formed in the fully epitaxially deposited drift region 22 by implantation. It would also be possible to form the body region 23 during epitaxial deposition by appropriately providing dopants of the second conductivity type in the desired concentration. The source region 24 can also be formed as a substantially continuous layer by implantation or during epitaxial deposition. If desired, the manufacturing can include separate epitaxial deposition processes with different dopants of varying concentration or with the same dopant but with varying concentration to form the respective functional regions. In some embodiments, the final doping concentration of the drift region 22 can vary to include doping profiles having at least one minimum or at least one maximum or having an increasing or decreasing doping concentration from the drain region 21 to the body region 23.

In other embodiments, a substrate wafer having the desired background doping concentration of the drift region 22 is provided. The substrate wafer is suitably thinned and body region 23 and source region 24 are formed by implantation at the first surface 11. If desired, the substrate wafer can be further thinned at the second surface 12 and the drain region 21 is formed by implantation at the second surface 12. It would also be possible to thin the substrate wafer after implanting source and body regions 23, 24 only. By using this approach, an expensive epitaxial deposition can be avoided.

The electrode structure 40 is arranged on the first surface 11 and insulated therefrom by a dielectric layer 45 having a first dielectric layer or portion 45a and second dielectric layer or portion 45b. The first dielectric portion 45a is arranged between the first electrode portion 41 and the semiconductor substrate 2 while the second dielectric portion 45b is arranged between the second electrode portion 42 and the semiconductor substrate 2. More particularly, first dielectric portion 45a functions as gate dielectric layer and insulates the first electrode portions 41 from the body regions 23 and portions of the drift region 22 while the second dielectric portion 45b serves as capacitor dielectric and insulates the second electrode portions 45b from depletable regions which are illustrated in FIG. 2B and portions of the body regions 23.

FIG. 2B illustrates depletable regions 26 of the second conductivity type which are formed between adjacent body regions 23 when viewing in the cross-section along line BB' in FIG. 1A. No depletable regions are formed between adjacent body regions when viewing along line AA' in FIG. 1A. The depletable regions 26 are typically arranged at least partially at the first surface 11 of the semiconductor substrate 2 and electrically connect adjacent body regions 23 along line BB'. Third pn-junctions 34 are formed between respective depletable regions 26 and the drift region 22. Different to the embodiment illustrated in FIG. 2B, depletable regions 26 need not to be formed between all adjacent body regions along line BB'. The number of depletable regions 26 and the area they cover can be adjusted according to specific needs.

The depletable regions 26 typically have a doping concentration which is less than the doping concentration of the body regions 23. In one or more embodiments, the depletable regions 26 can have a typical net doping concentration in a range from about $5*10^{13}/cm^3$ to about $1*10^{17}/cm^3$. The doping concentration of the depletable regions 26 should be selected in view of the specification of the semiconductor device 1, particularly the desired blocking or reverse voltage. In one embodiment, the depletable regions 26 are completely depleted above a given reverse threshold voltage. As described in greater detail below, this results in an at least a partial decoupling of the electrode structure from the body and source regions 23, 24 and in an increase of the gate-drain capacitance. The doping concentration of the depletable region 26 should be selected such that the doping dose of the depletable region is less than the breakdown charge of the semiconductor material. Since the doping dose is the integral over the doping concentration along the electric field lines, the "width" or thickness of the depletable region also influences the doping dose. A skilled person will appreciate that thin depletable regions, for example, can have a higher doping concentration than thicker depletable regions.

Figure 4A:
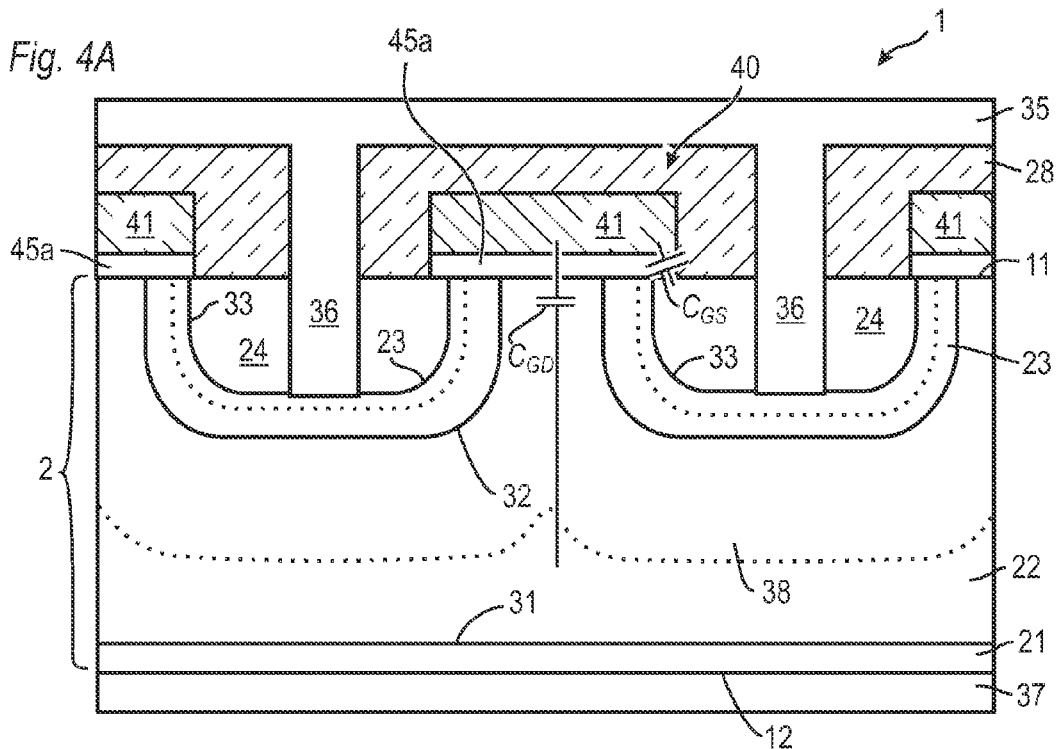
FIGS. 4A and 4B illustrate the extent of the depletion zone for different cross-sectional views at high reverse voltage.
Figure 4B:
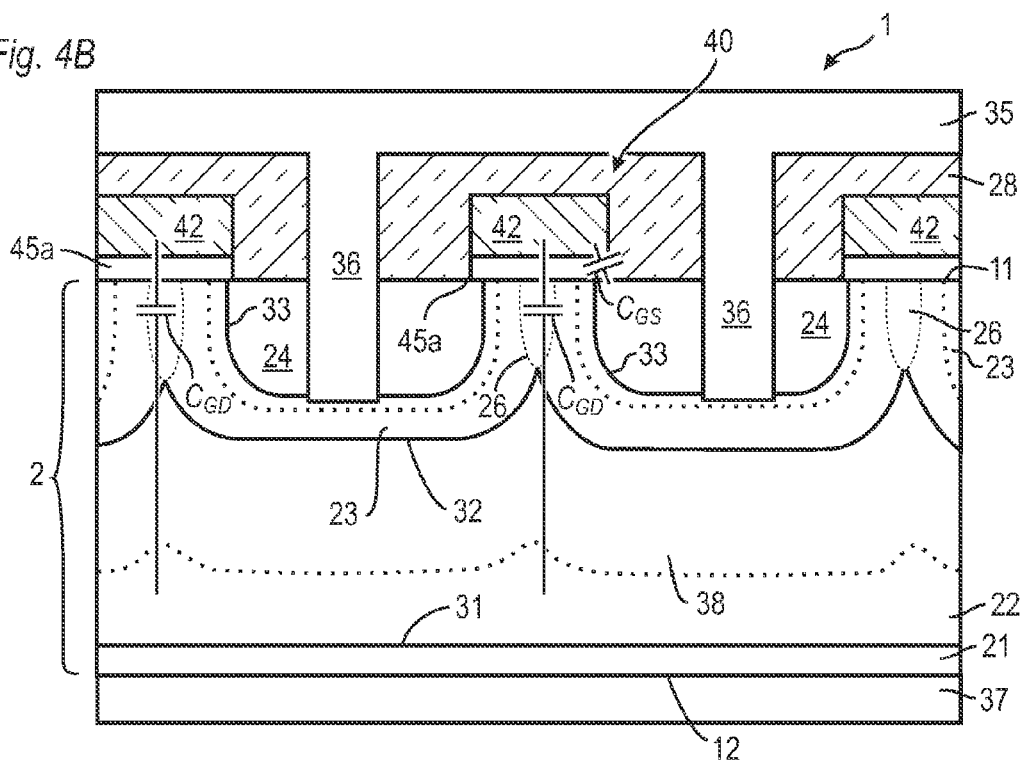

For better illustrating the capacitance switching behaviour, without being wished to be limited thereto, reference is made to FIGS. 3A to 4B which illustrates enlarged portions of a semiconductor device. FIGS. 3A and 4A illustrate a cross-section along a line corresponding to line AA' in FIG. 1A and FIGS. 3B and 4B illustrate a cross-section along a line corresponding to line BB'. The embodiment of FIGS. 3A to 4B does not include compensation regions. In addition to the embodiment of FIGS. 2A and 2B, the embodiment of FIGS. 3A to 4B includes an insulation layer 28 which is formed on the first surface 11 and embeds the electrode structure 40. A first metallization 35 is arranged on the insulation layer 28 and is in contact with body regions 23 and source regions 24 through plugs 36. A second metallization 37 is formed on the second surface 12 to provide a contact to drain region 21. The first and second metallizations 35, 37 can be made of or can contain any suitable electrically conductive material including, without being limited thereto, highly doped polysilicon, aluminium, aluminium alloy, copper, copper alloy, nickel alloys, metal compositions, metal alloys and multilayer metallizations including a barrier or contact layer such as a titanium nitride layer and a metal layer. The plug 36 can be formed of the same material as the metallization 35, 37 or of a material different thereto. In one or more embodiments, the plug is made of highly doped polysilicon. Furthermore, in one or more embodiments the first metallization 35 includes an AlSiCu alloy while the second metallization 37 includes a nickel alloy for improving solderability of the second metallization 37. A skilled person will appreciate that respective highly doped contact regions can be formed in the body regions 23 and source regions 24 to provide good ohmic contact to the plugs 36.

The semiconductor device 1 is illustrated to be in reverse state in FIGS. 3A to 4B, wherein the reverse voltage applied between first and second metallization 35, 37 is lower in FIGS. 3A and 3B than in FIGS. 4A and 4B. The reverse voltage of FIGS. 4A and 4B is particularly above a given threshold voltage for completely depleting the depletable regions 26.

The spatial extent of the so called space-charge region or depletion zone 38 forming along the first pn-junction 32 is illustrated by dotted lines in FIGS. 3A to 4B. When no depletable region 26 is arranged between two adjacent body regions 23 as illustrated in FIG. 3A, the electrode structure 40, i.e. the first electrode portion or the gate electrode 41, respectively, forms a gate-source capacitance $C_{GS}$ and a gate-drain capacitance $C_{GD}$ depending on the extension of the space-charge region 38. Since body and source region 23, 24 are electrically connected by plugs 36 and are at source potential, the area of the gate-source capacitance $C_{GS}$ assumes the laterally outer portions of the gate electrode 41, i.e. the area where the gate electrode 41 overlaps the source regions 24 and the field-free portions of the body regions 23, in which no space-charge region 38 is formed. The field-free portions of the body regions 23 and the source regions 24 form the counter electrode of the gate-source-capacitance $C_{GS}$.

On the other hand, the central portion of the gate electrode 41 forms the gate-drain capacitance $C_{GD}$. The counter electrode is formed here by the field-free portions of the drift region 22, i.e. the portions of the drift region 22 which are below the space-charge region 38. The "capacitor dielectric layer" of the gate-drain capacitance is formed by the first dielectric layer 45a and the space-charge region 38. Since the extension of the space-charge region 38 changes with the reverse or blocking voltage the "thickness" of the capacitor dielectric layer depends on the reverse voltage.

The situation is different for the structure illustrated in FIG. 3B where selected adjacent body regions 23 are electrically connected by depletable regions 26. When the reverse voltage applied between source and drain regions is below a threshold voltage, the depletable region 26 is not yet completely depleted and still electrically connects adjacent body regions 23 with each other at the first surface 11. This means that the complete second electrode portion 42 forms a capacitance electrode of the gate-source capacitance $C_{GS}$.

With increasing reverse voltage, the spatial extent of the space-charge region 38 increases wherein the most pronounced increase occurs in the drift region 22 which is lower doped than the body regions 23. For the structure illustrated in FIG. 4A corresponding to the structure of FIG. 3A no significant change occurs. The overlap region between the gate electrode 41 and the source regions 24 and the field free body regions 23 substantially remain constant so that the gate-source-capacitance $C_{GS}$ also remains substantially constant. Different thereto the gate-drain capacitance $C_{GD}$ decreases since the distance between the counter electrode, i.e. the field free portion of the drift region 22, and the central portion of the gate electrode 41 increases, and this leads to a reduced gate-drain capacitance $C_{GD}$ in this region.

For the structure illustrated in FIG. 3B at high reverse voltage the situation is illustrated in FIG. 4B. The depletable region 26 is now completely depleted and the adjacent body regions 23 are therefore electrically insulated from each other. This means that now a gate-drain capacitance $C_{GD}$ is formed between a central portion of the capacitor electrode 42 and the field-free portions of the drift region 22. Hence, the structure illustrated in FIG. 3B switches from a single gate-source capacitance $C_{GS}$ to a combination of a gate-source capacitance $C_{GS}$ and a gate-drain capacitance $C_{GD}$ so that the total gate-drain capacitance $C_{GD}$ abruptly increases when the reversed voltage becomes higher than a threshold voltage at which the depletable region 26 becomes completely depleted, and the adjacent body regions 23 become insulated from each other.

Figure 5A:
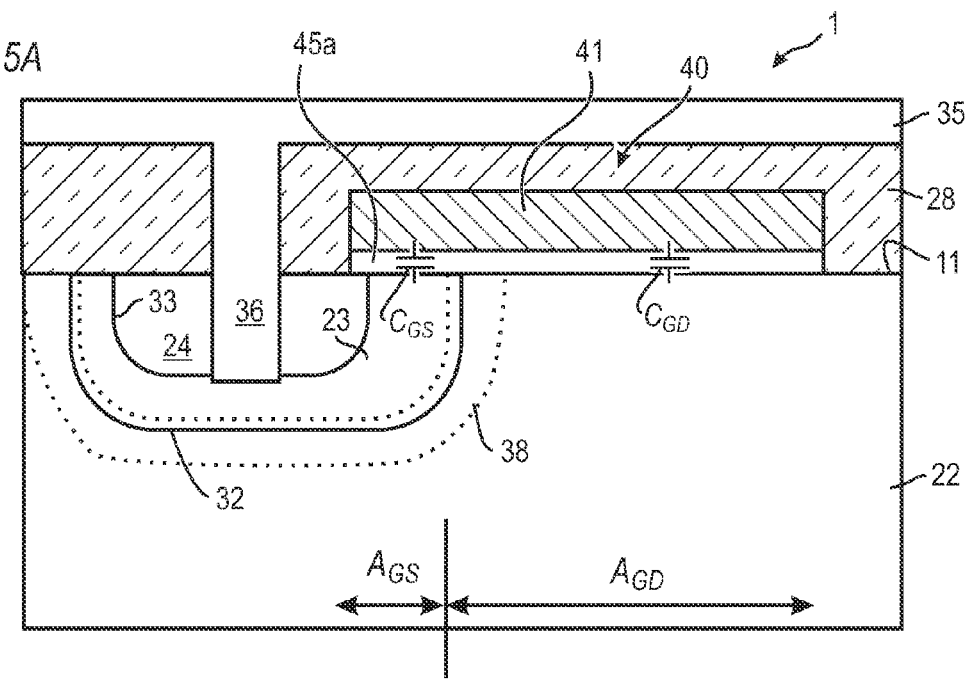
FIGS. 5A and 5B illustrate the extent of the depletion zone for different reverse voltages for an area having no depletable region.
Figure 5B:
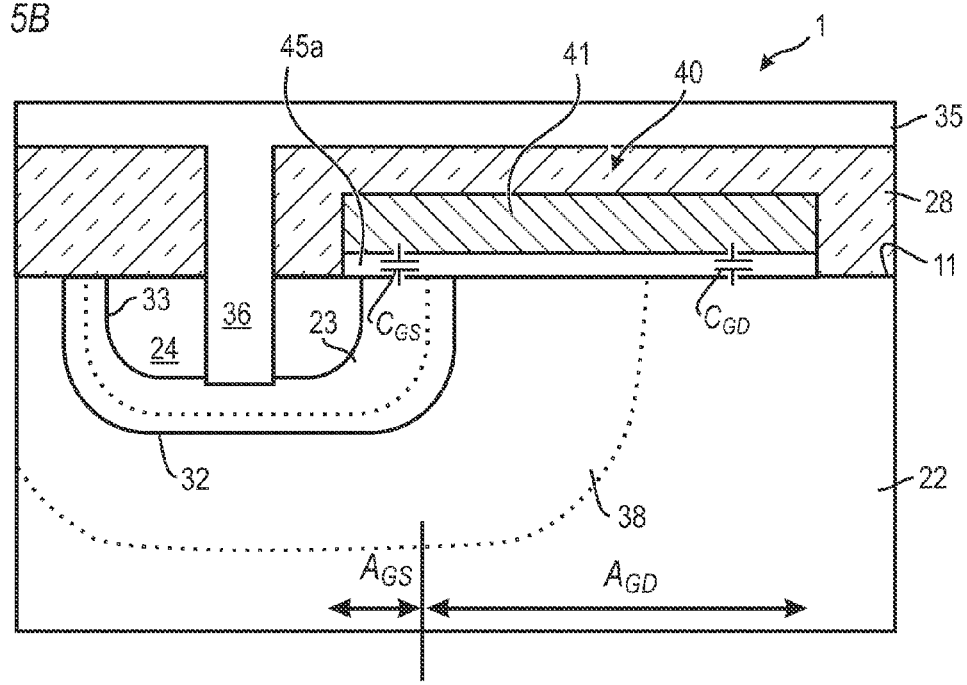
Figure 6A:
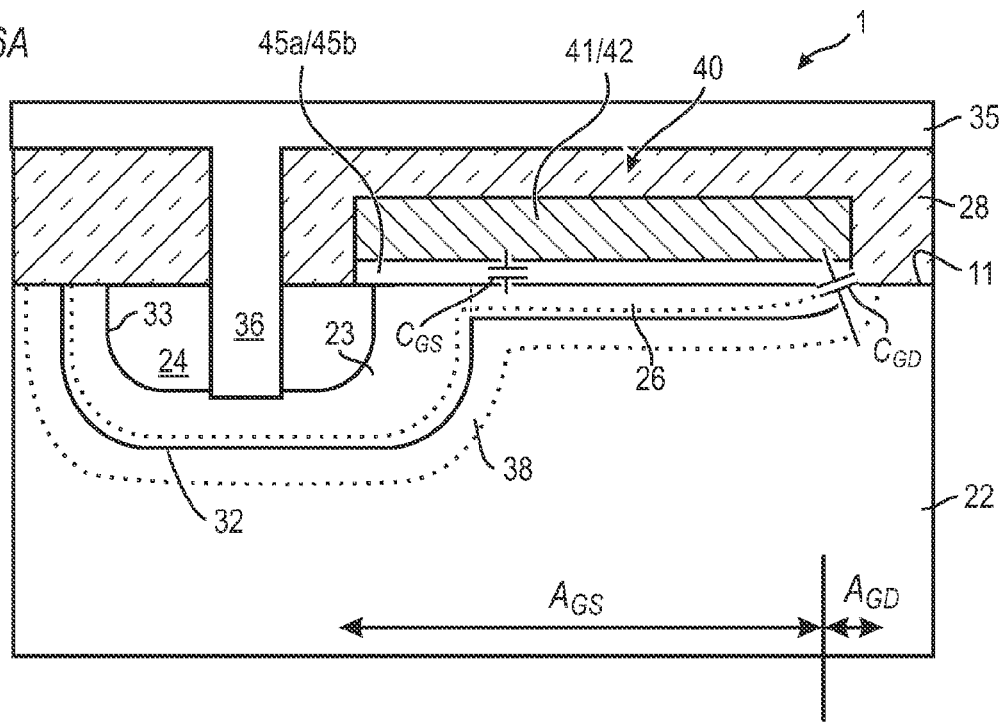
FIGS. 6A and 6B illustrate the extent of the space-charge region for different reverse voltages for an area having a depletable region adjoining the body region.
Figure 6B:
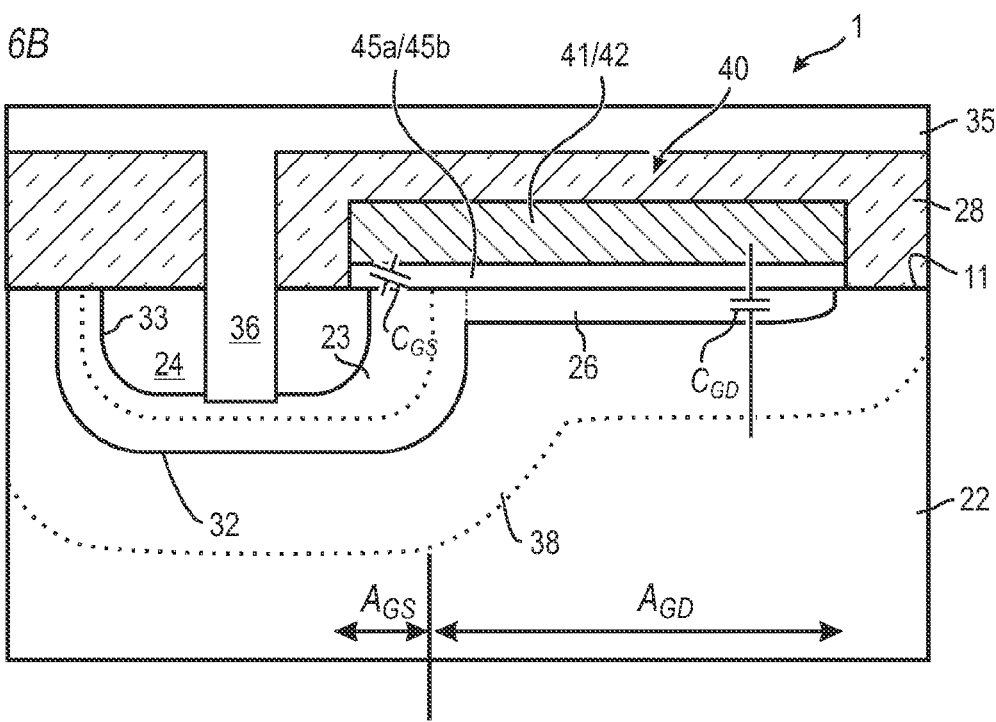

Such a switching behaviour can also be obtained with a depletable region 26 adjoining a single body region 23 only. FIGS. 5A and 5B illustrate a structure having no depletable region while FIGS. 6A and 6B illustrate a structure having a depletable region 26 at different reverse voltages. FIGS. 5A to 6B only illustrate the upper portion of a semiconductor device 1. The respective capacitor regions $A_{GS}$ for the gate-source capacitance and $A_{GD}$ for the gate-drain capacitance, respectively, are indicated in the Figures. When comparing FIGS. 5A and 5B, the overlap between the gate electrode 41 on one hand and the source region 24 and the field free portions of the body region 23 of the other hand remains substantially constant at different reverse voltages. The overlap between the gate electrode 41 and the field-free drift region 22 reduces with increasing reverse voltage due to the increase space-charge region 38. The increased extension of the space-charge region 38 forming a portion of the capacitor dielectric layer leads to an overall reduction of the gate-source capacitance $C_{GS}$. However, the overall area $A_{GD}$ assumed by the gate-drain capacitance $C_{GD}$ remains substantially constant.

When comparing FIGS. 5A and 5B with FIGS. 6A and 6B it becomes evident that the depletable region 26 causes a significant increase of the gate-drain region $A_{GD}$ and hence the gate-drain capacitance $C_{GD}$ above a given threshold voltage. When the reverse voltage is below the threshold, the depletable region 26 is not yet completely depleted and forms part of the counter electrode to the electrode structure 40 so that a large gate-source capacitance $C_{GS}$ is formed. The corresponding area of gate-source capacitance $C_{GS}$ is illustrated in FIG. 6A. The gate-drain capacitance $C_{GD}$ is small since the still conductive depletable region 26 shields large portions of the electrode structure 40 from the drift region 22.

When the reverse voltage increases, the depletable regions 26 becomes depleted and the shielding effect of the depletable region 26 vanishes so that a large gate-drain capacitance $C_{GD}$ is formed while the gate-source capacitance $C_{GS}$ significantly reduces. In other words, in case of the additional depletable region 26 as illustrated in FIG. 6A the gate-drain capacitance $C_{GD}$ is significantly smaller for reverse or blocking voltages below a threshold voltage than in the reference structures illustrated in FIG. 5a. Above the threshold voltage both structures have a comparable gate-drain capacitance $C_{GD}$. This situation is illustrated in FIG. 6B. As it becomes apparent from a comparison between FIGS. 6A and 6B, the area, which the gate-drain capacitance $C_{GD}$ assumes at high reverse voltages, covers now also the area of the depletable region 26. Hence, the increase of the gate-drain capacitance $C_{GD}$ can be adjusted by appropriately selecting the size of the depletable region 26.

Figure 13:
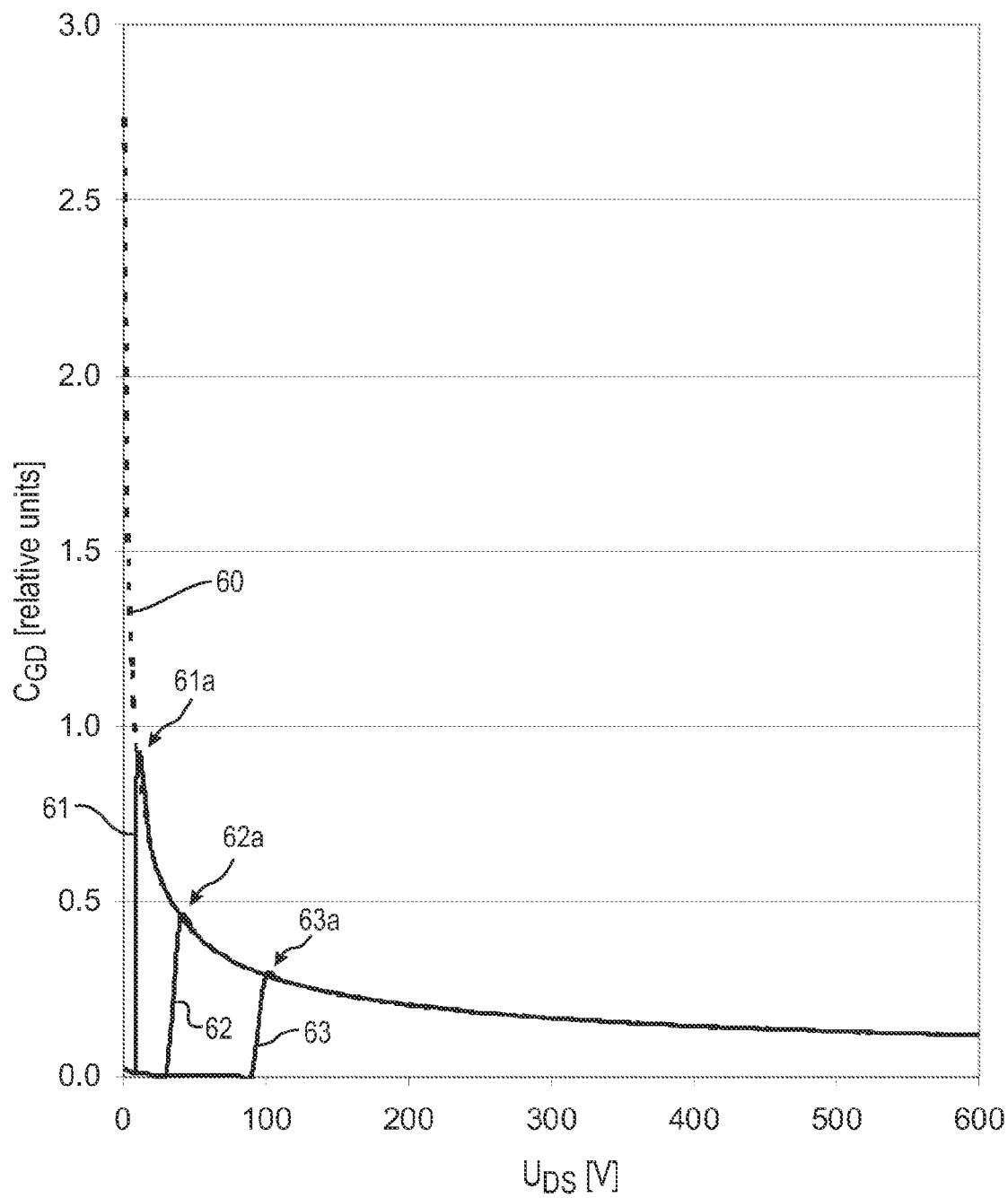
FIG. 13 illustrates the dependency of the gate-drain capacity on the reverse voltage.

The gate-drain capacitance $C_{GD}$ as a function of the reverse voltage $U_{DS}$ (voltage between drain and source) is also illustrated in FIG. 13. For the respective simulations it is assumed that the initial gate-drain capacitance $C_{GD}$ covers 1% of the total area covered by the respective dielectric layers. Dashed line 60 illustrates the gate-drain capacitance $C_{GD}$ of the reference structure illustrated in FIG. 5A which do not have a depletable region. With increasing reverse voltage, $C_{GD}$ monotonically decreases. Different thereto are curves 61, 62 and 63 which illustrate the gate-drain capacitance $C_{GD}$ for structures having a depletable region (FIG. 6A) to extent the space-charge region 38 at the surface close to the electrode structure 40. Curves 61, 62 and 63 differ in their respective "threshold voltages" which are about 10 V for curve 61, about 30 V for curve 62, and about 100 V for curve 63. The threshold voltage can be adjusted, for example, by varying the doping dose of the depletable region with higher doping doses resulting in a higher threshold voltage. Below the threshold voltage, $C_{GD}$ is comparably small and jumps at the threshold voltage to the value of the reference structure. Since $C_{GD}$ of the reference structure monotonically drops with increasing reverse voltage, curves 61, 62 and 63 has a local maximum 61a, 62a and 63a, respectively, at the respective threshold voltages. The overall reduction of $C_{GD}$ is thus significantly smaller for devices having a depletable region. The reduced $C_{GD}$ at low reverse voltages produces a more flat course of the gate-drain voltage during switching. A skilled person will appreciate that the overall course of the gate-drain capacitance is also determined by the ratio between device areas having a depletable region and device areas having no depletable regions. FIG. 13 illustrates the course for device areas having depletable regions. This yields the sharp jump at the threshold voltage. Integrating the depletable regions 26 at selected areas only would lessen the sharp increase and would produce an even smoother course of $C_{GD}$.

The course of the resulting gate-drain capacitance $C_{GD}$ of the semiconductor device can be configured. For example, in one or more embodiments, the semiconductor device can include capacitor structures which have different courses of the respective gate-drain capacitance with respect to the reverse voltage $U_{DS}$. For example, a semiconductor device can include at least a first capacitor structure with a first threshold voltage and at least a second capacitor structure with a second threshold voltage different to the first threshold voltage. First and second capacitor structures, each of which forming a capacitor, are connected in parallel to each other. The gate-drain capacitance of the first capacitor structure can have, for example, a lower threshold voltage than the second capacitor structure. As a consequence, both capacitor structures exhibit a local maximum at different threshold voltage. Since the capacitor structures are connected parallel to each other, the resulting gate-drain capacitance of the semiconductor device exhibits two local maxima.

In one or more embodiments as described herein, the semiconductor device can include a first capacitance structure having a depletable region 26 and a second capacitor structure which does not have a depletable region. The capacitor structure having the depletable region "switches" at a given threshold, for example, corresponding to curve 62 in FIG. 13, while the capacitor structure without a depletable region exhibits a gate-drain capacitance course comparable to curve 60. The combined course of the gate-drain capacitor of both capacitor structures yield a reduced gate-capacitance at low reverse voltage $U_{DS}$ with at least one maximum.

When combining two, three, four or a plurality of capacitor structures of different threshold voltage, it is also possible to obtain a more plateau-like course of the resulting gate-drain capacitance. For example, it is possible to combine four capacitor structures each having a gate-drain capacitance course corresponding to a respective one of the curves 60 to 63. The resulting gate-drain capacitance would exhibit a plateau at low reverse voltage.

FIG. 13 illustrates the relative course of the gate-drain capacitance. The absolute course also depends, inter alia, on the area assumed by the respective capacitor structure. A skilled person will appreciate that the course of the resulting gate-drain capacitance of the semiconductor device is therefore also determined by the relation of the areas assumed by the respective capacitor structures. Hence, the course of the total or resulting gate-drain capacitance can be adjusted by appropriately variation of at least one of the doping level of the depletable region to adapt the threshold voltage, the capacitor area, the area assumed by the depletable region or regions, and the thickness and the material of the dielectric layer, or a suitable combination of these measures.

It is also possible to provide a depletable region 26 with a varying doping concentration so that that the depletable region is step-wise depleted. In one or more embodiments as described herein, a depletable region includes a first portion having a lower doping concentration than a second portion of the depletable region. In some embodiments, the second portion having the higher doping concentration adjoins the body region and is arranged between the body region and the first portion. In this case, the first portion is depleted at a lower reverse voltage than the second portion. The depletable region 26 therefore exhibits two threshold voltages.

The semiconductor device as described herein therefore includes in one or more embodiments a capacitor structure with a capacitance which varies depending on the reverse voltage and having a local maximum at a given threshold voltage. In one or more embodiments, a varying capacitance can be obtained by providing the electrode structure with a plurality of first bars each forming a gate electrode portion and a plurality of second bars each forming switch gate portion. For example, FIG. 1A illustrates such an arrangement. In this embodiment, the first bars, which form the first electrode portions 41, run perpendicular to the second bars, which form the second electrode portions 42, when seen in a plan view onto the first surface. The first electrode portions 41 functions as gate electrodes since they are arranged above the body regions 23 to allow formation of inverse channels in the body regions 23. The inversion channel carries the load current in the on-state of the semiconductor device 1. Different thereto, the second electrode portions 42 serves as switch gate portion or switchable capacitor electrode since they are arranged at least in portions above the depletable regions 26. Although inversion channels might also be formed in the depletable regions 26, those inversion channels typically do not significantly contribute to the load current.

Figure 1B:
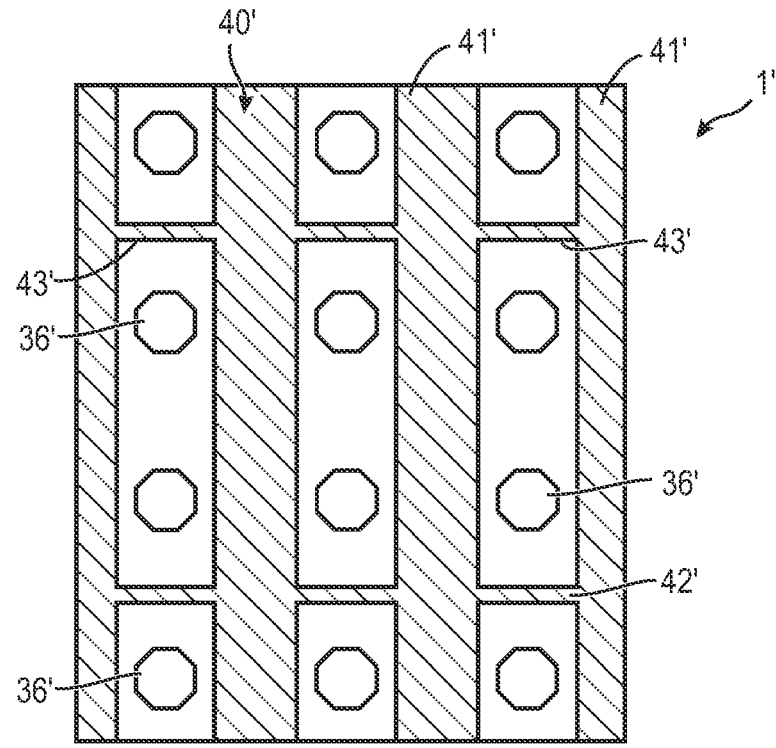
FIG. 1B illustrates one embodiment of a reference structure.

Depletable regions 26 can be, for example, formed by implantation using an appropriately designed electrode structure 40 as implantation. FIG. 1A gives a plan view on electrode structure 40 of an embodiment. For comparison, the plan view on an electrode structure 40' of a reference semiconductor device 1' is illustrated in FIG. 1B. In both structures the vertically running bars or stripes 41, 41' form gate electrode structures. The laterally running bars or stripes 42' in the reference device 1' merely electrically connect the vertical bars 41' which each other while in the embodiment of FIG. 1A, the laterally running bars or stripes 42 electrically connect the vertical bars 41 and serve additionally as switching or capacitor electrode. The width d2 of the bars 42 is larger than the width of the bars 42'. The arrangement and size of the electrode structures 40, 40' define the location and lateral extension of the body regions since the electrode structures 40, 40' are used as implantation mask for implanting a dopant to form the body regions. This allows the formation of depletable regions 26 under the laterally running bars 42 different to the comparably thin laterally running bars 42' of the reference device V.

A skilled person will appreciate that FIGS. 1A and 1B only illustrate a specific layout of the electrode structure 40. Other layouts such as hexagonal structures are also possible.

By appropriately designing the layout of the electrode structure, it is possible to form semiconductor devices which exhibit a reduced gate-drain capacitance $C_{GD}$ particularly below a given threshold voltages without significantly increasing the gate charge. Hence, the feedback or Miller capacitance of the device can be appropriately adjusted by increasing the area covered by the electrode structure particularly above depletable regions. This allows a voltage-dependent increase of the gate-drain capacitance $C_{GD}$ or, in other words, a less pronounced overall reduction of $C_{GD}$ with increasing reverse voltage.

In some embodiments, diffused portions of the body regions 26 form depletable regions 26 covered by the electrode structure 40 since the doping concentration decreases towards the edges of the body regions 26. In other embodiments, depletable regions 26 are formed by a separate implantation. The depletable regions 26 contribute to the extent and location of the space-charge region 38 below and next to the electrode structure 40. As described above, the extent of the space-charge region 38 can significantly influence the gate-drain capacitance $C_{GD}$ and also the gate-source capacitance $C_{GS}$. For illustration purposes, the area of the electrode structure 40 arranged above the space-charge region 38 can be considered as portion which contributes to the gate-drain capacitance $C_{GD}$. Since this portion significantly changes with the reverse voltage, the gate-drain capacitance $C_{GD}$ also changes. By incorporating depletable regions at selected locations the variation of the spatial extent of the space-charge region with the reverse voltage can be tailored so that large changes of the gate-drain capacitance $C_{GD}$ can be obtained.

The design of the electrode structure's layout can be changed either globally or only locally to incorporate switchable capacitances in selected portions of the semiconductor device 1. For example, increasing the area of the electrode structure 40 above the space-charge region 38 by a factor of about 40% to 42% contributes to an improved switching behaviour of the devices. Particularly, the increased gate-drain capacitance $C_{GD}$ reduces steep voltage variations during switching and therefore damps oscillations which can be caused by inductive and/or capacitive parasitics which are formed, for example, by conductive connections.

According to one or more embodiments, the semiconductor device therefore includes an configured electrode structure and at least one depletable region which increase the spatial extent of the space-charge region such that the electrode structure covers large portions of the increased space-charge region.

Figure 7:
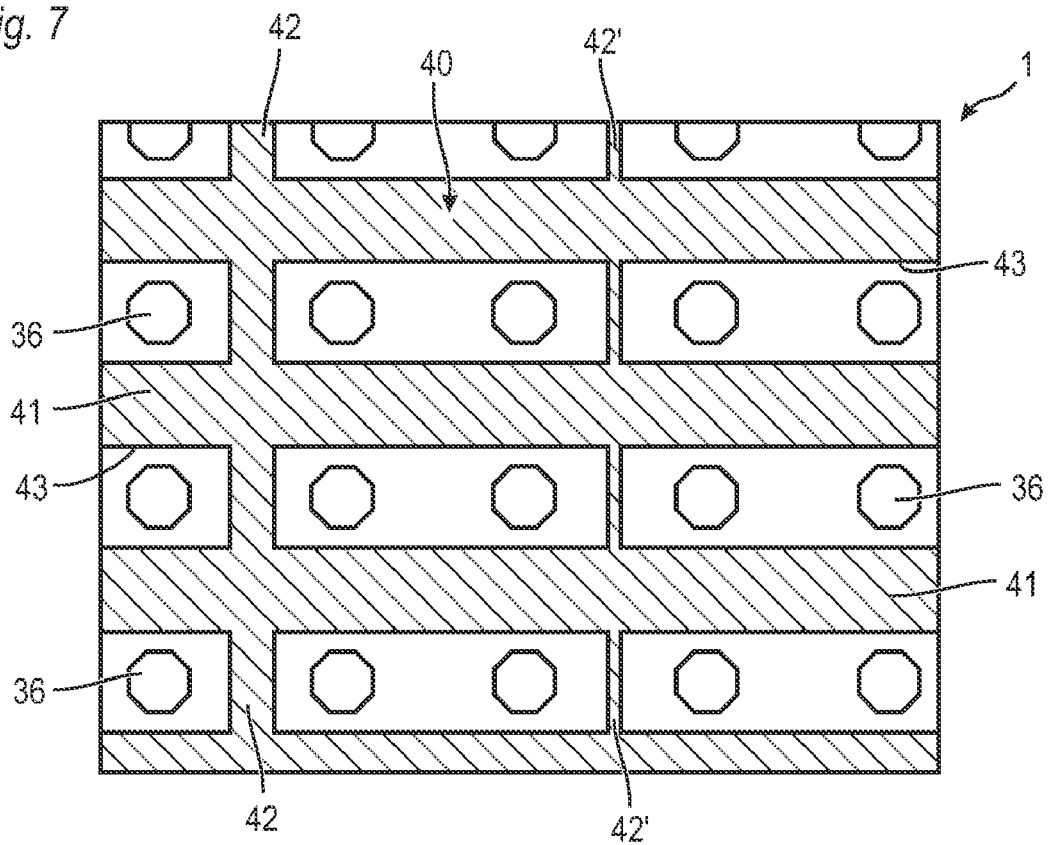
FIG. 7 illustrates the layout of an electrode structure according to one embodiment.
Figure 8:
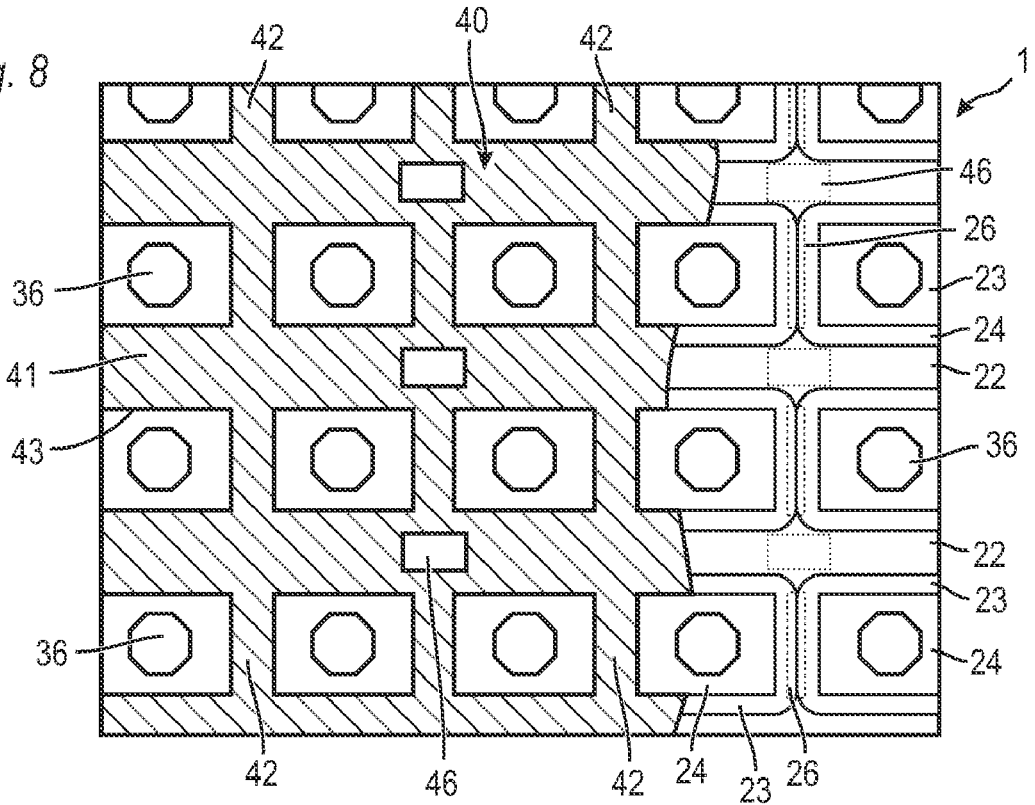
FIG. 8 illustrates the layout of an electrode structure according to one embodiment.

Further embodiments are illustrated in FIGS. 7 and 8 which illustrate plan views on a semiconductor device 1. In FIG. 7, capacitor electrode portions 42 alternate with electrical connections 42' which merely provide an electrical connection between adjacent gate electrode portions 41 of the electrode structure 40. Gate electrode portions 41 are running in this embodiment laterally while the capacitor electrode portions 42 are running vertically. The capacitor electrode portions 42 of the electrode structure 40 are arranged in this embodiment at selected locations only. In case that the electrode structure 40 is used as implantation mask, this affects also the place where the depletable regions 26 are formed since they are formed only below the capacitor electrode portions 42.

To reduce the gate charge, gate-charge reducing openings 46 can be formed in the electrode structure 40 as illustrated in FIG. 8. The gate-charge reducing openings 46 can be formed in those portions of the electrode structure 40 which neither cover body regions 23 nor depletable regions 26. This is for instance illustrated in FIG. 8 where the electrode structure 40 is partially removed in the right portion of the FIG. 8 to indicate the location of the source regions 24 and body regions 23 usually covered by the electrode structure 40. The location of the gate-charge reducing openings 46 are illustrated as phantom lines. Also indicated is the location of the depletable regions 26 which are arranged where the diffused regions of adjacent body regions 23 comes close together and partially overlap each other. Since the laterally running gate electrode portions 41 have a large width, adjacent body regions 23, which are vertically spaced in the illustration of FIG. 8, are too remote from each other to have their diffused regions merged. Therefore, portions of the drift region 22 are arranged between such body regions. In this particular embodiment, the gate-charge reducing openings 46 are arranged in regions external to the main current path which is directly between vertically spaced body regions 23.

Although the gate-charge reducing openings 46 would allow implantation of a dopant when the electrode structure 40 is used as implantation mask, the size of the gate-charge reducing openings 46 is selected such that thus formed doping regions, which would be of the same conductivity type as the body regions 23, are completely depleted or ionised under reverse conditions and thus adjacent portions of the electrode structure 40 are arranged above the thus formed space-charge region 38. To illustrate this, a typical width d1 of the gate electrode portion 41 is in a range of about 3 μm and the width of a gate-charge reducing opening 46 would then be in a range from about 0.25 μm to about 0.5 μm. During source implantation, the gate-charge reducing openings 46 can be covered by an uncritical mask to avoid introduction of dopants of reverse doping type to the body regions 23.

It would, however, also be possible to form gate-charge reducing openings 46 at locations different to the one illustrated in FIG. 8, for example, above body regions 23 or even depletable regions 26. When forming gate-charge reducing openings 46 above body regions 23 for example, the gate charge and the capacitance are not significantly changed at small reverse voltages. This also contributes to an improved switching behaviour.

Alternative or in addition thereto, it would also be possible to form a thicker dielectric layer 45 in the regions of the gate-charge reducing openings 46. Such a thicker dielectric layer could be, for example, formed together with dielectric layers formed for different purposes, for example, a thick field oxide in the periphery region of the semiconductor device.

In further embodiments, the electrode structure 40 could be designed to have a meander-like, ladder-like and/or fjord-like shape or shapes to allow formation of depletable regions below the electrode structure 40 while maintaining the overall area covered by the electrode structure 40 to keep the gate charge substantially constant. Furthermore, the channel width of the device should not be affected by the design change.

Figure 11A:
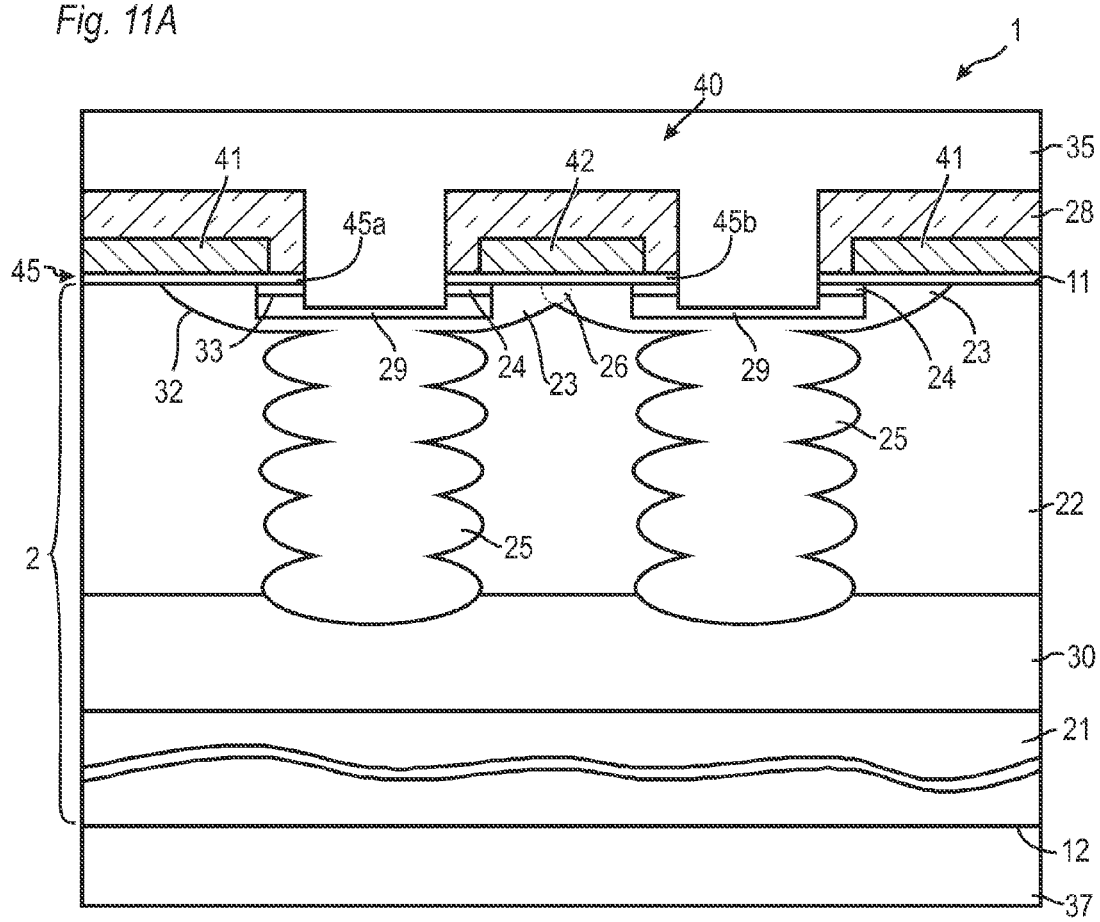
FIGS. 11A and 11B illustrate a semiconductor device according to one embodiment having compensation regions.
Figure 11B:
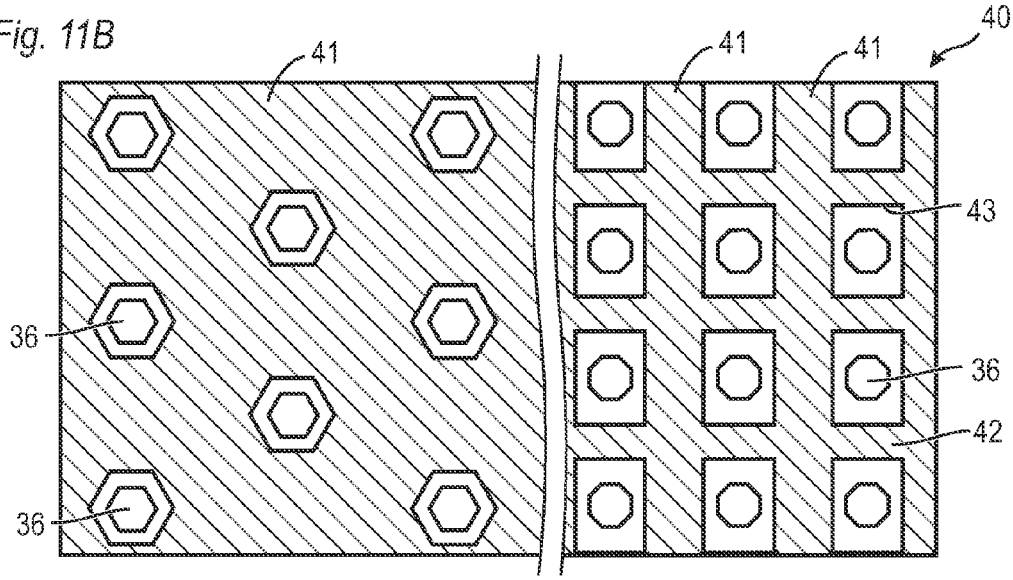

In other embodiments, portions of the semiconductor device are formed with a fully covering electrode structure such as a hexagonal structure while other portions are covered with a different layout, for example, the bar-shaped layout illustrated, for example, in FIG. 8. This partially increases the Miller capacitance of the device which is sufficient for many applications. A device having areas of differently shaped electrode structure is also illustrated in FIG. 11B. Therein, the hexagonal layout can also be replaced by a squared layout. In one embodiment, the dielectric layer 45 between the electrode structure 40 and the semiconductor substrate 2 can have portions with different thickness and/or different dielectric permittivity to increase the Miller or the gate-drain capacitance, respectively. Therefore, in some embodiments, the semiconductor device 1 includes a first dielectric layer 45a, which is arranged between the first electrode portion 41 and at least the body region 23, and a second dielectric layer 45b, which is arranged between the second electrode portion 42 and at least the depletable region 26. In one or more embodiments, the first dielectric layer 45a can include a first thickness and the second dielectric layer 45b can include a second thickness, wherein the first and second thicknesses differ from each other. In one embodiment, the first dielectric layer 45a can include a first dielectric permittivity and the second dielectric layer 45b can include a second dielectric permittivity, wherein the first and second dielectric permittivities differ from each other.

Locally increasing the dielectric permittivity at selected areas provides further options to tailor the switching behaviour of the semiconductor device 1. For example, it is possible to provide the second dielectric layer 45b between the depletable region 26 and the electrode structure 40 with an increased dielectric permittivity. In this case, different materials can be used to form the first and second dielectric layer 45a, 45b. It would also be possible to reduce selectively the thickness, for example, of the second dielectric layer 45b, to increase further the switchable capacitance. A skilled person will appreciate that a combination of theses options is also possible.

In one or more embodiments, the dielectric layer 45 is provided at selected portions with an increased or decrease dielectric permittivity and/or the thickness independent of the formation of a depletable region 26. It would even be possible to form semiconductor devices which do not include a depletable region 26 but which include an dielectric layer 45 arranged between the electrode structure 40 and portions of the body regions 23 and/or portions of the drift region 22, wherein the dielectric layer 45 includes regions with increased dielectric permittivity and/or thickness to adjust the gate-drain capacitance $C_{GD}$.

Figure 12:
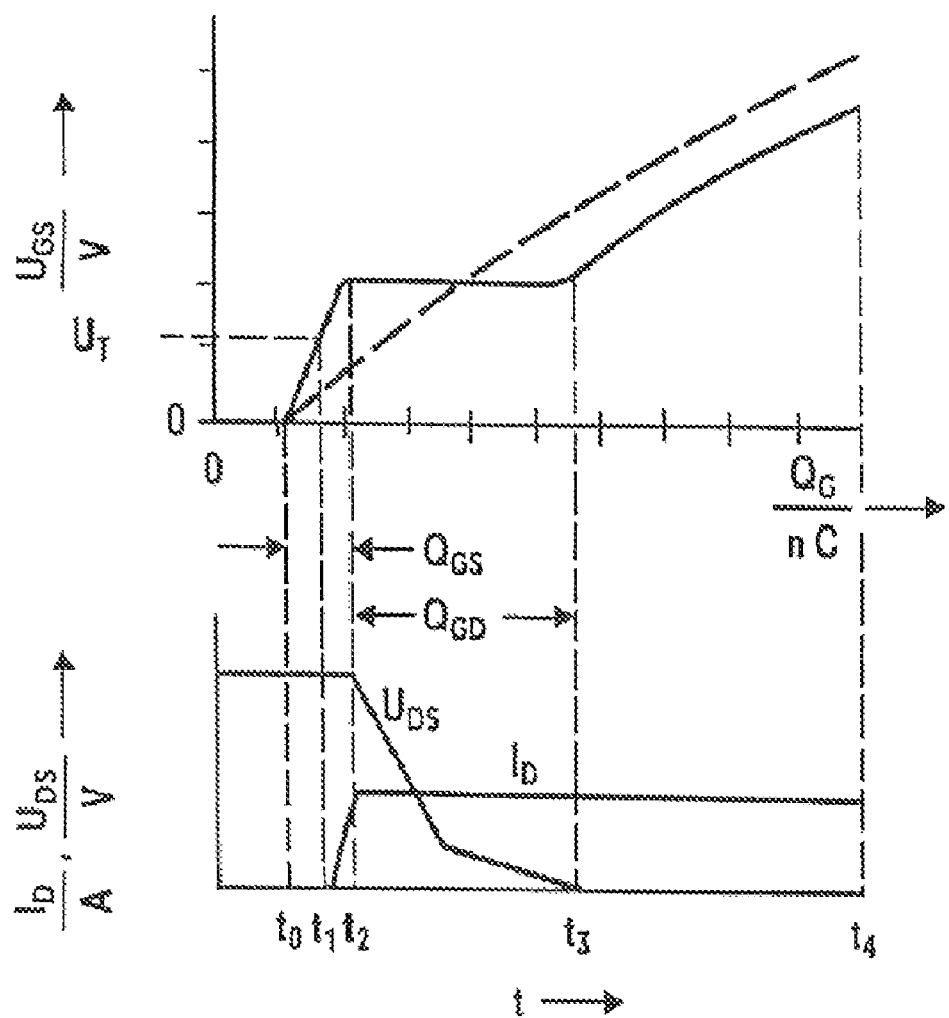
FIG. 12 illustrates the effect of Miller capacitance on the device's switching behaviour.

By forming switchable capacitances without noticeable change of the gate charge, the switching losses of the semiconductor device 1 can be reduced. Switching losses occur when a high current flows through the device at high voltages. This is the case for intermediate switching states, during switching-on, indicated in FIG. 12 between $t_2$ and $t_3$. In this state, the load current flows through the device while the voltage between drain and source is still high. The tailored course of the gate-drain capacitance $C_{GD}$ reduces switching losses and unwanted feedbacks which cause oscillations in comparison to additional conventional approaches for reducing oscillations, which approaches includes, for example, external resistors.

Figure 9A:
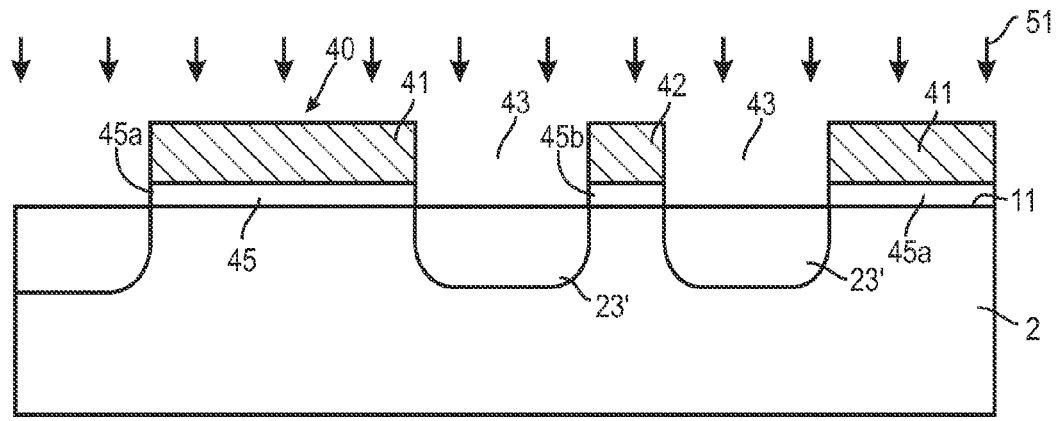
FIGS. 9A to 9C illustrate processes of a manufacturing method according to one embodiment.
Figure 9B:
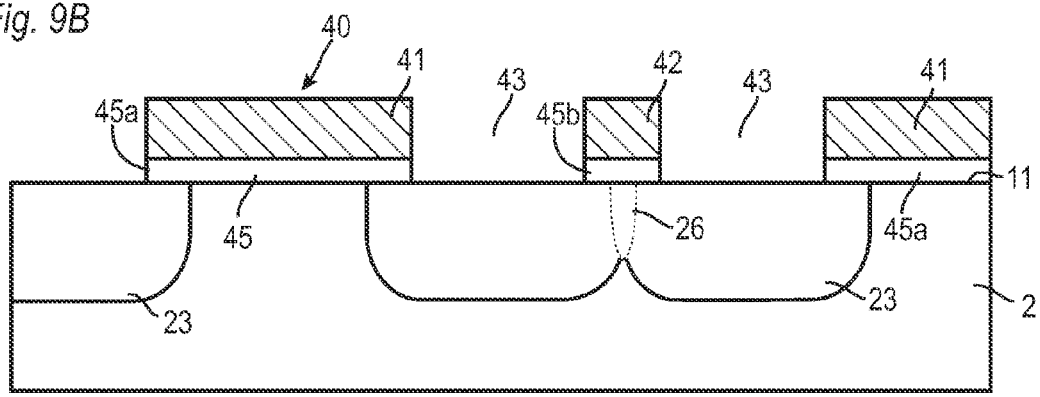
Figure 9C:
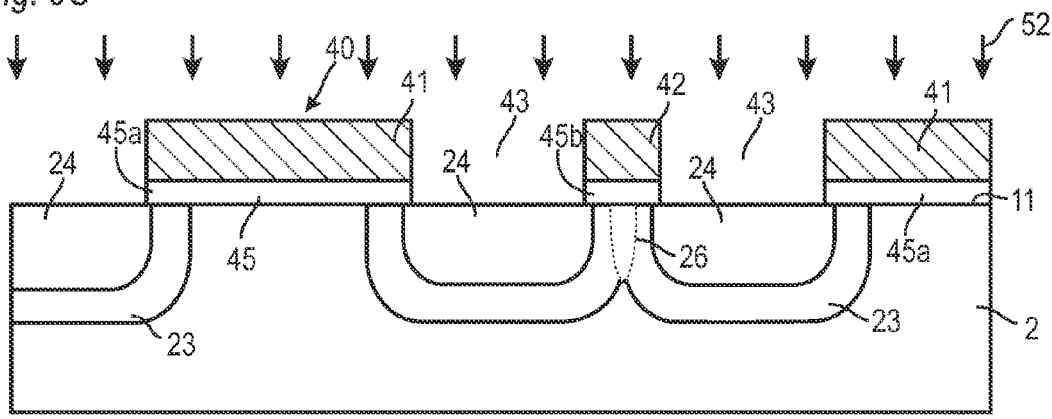

With reference to FIGS. 9A to 9C a method for manufacturing a semiconductor device according to an embodiment will be described. At FIG. 9A a semiconductor substrate 2 with a first surface 11 is provided. The semiconductor substrate 2 can be of a first conductivity type, for example, n-doped, and includes a drift region which extends up to the first surface 11. A dielectric layer 45 and a layer of a conductive material such as highly doped polysilicon are formed in this order on the first surface 11. Both layers are subsequently appropriately structured, for example, by forming a resist mask on the conductive material and etching the respective materials. As a result, a structured dielectric layer 45 having first and second dielectric layers 45a, 45b as well as a structured conductive layer corresponding to the electrode structure 40 having first and second electrode portions 41, 42 are formed, respectively. The electrode structure 40 includes the opening 43 illustrated in FIG. 1A, for example. As illustrated in FIG. 9A, the second dielectric layer 45b and the second electrode portions 42 have a smaller lateral width than the first dielectric layer 45a and the first electrode portion 41.

Subsequently, a dopant of the second conductivity type is implanted into the semiconductor material 2 with the electrode structure 40 serving as implantation mask. This leads to the formation of doping regions 23' which are formed self-aligned with respect to the electrode structure 40. As illustrated in FIG. 9A, the doping regions 23' are formed spaced apart from each other.

With a first thermal annealing process, the implanted dopant is outdiffused. Since the lateral spacing between adjacent doping regions 23' below the second electrode portion 42 is not very large, the doping regions 23' partially merge at these locations and form depletable regions 26 of significant lower doping concentration in comparison to the doping concentration within the doping regions 23'. The outdiffused doping regions 23' become the body regions 23. The resulting structure is illustrated in FIG. 9B. Whether or not depletable regions 26 will be formed below the second electrode portion 42s depends on the width d2 and the relevant parameters of the thermal annealing process or processes. This provides an option to control the formation of the depletable regions 26 and the relevant parameters should be selected accordingly.

In a further process, a dopant of the first conductivity is implanted using the electrode structure 40 as implantation mask to form the source regions 24, which are embedded in the body regions 23, in areas where the formation of source regions is desired. Otherwise, an uncritical mask can used to cover selected areas. A second thermal annealing process, typically a short annealing process, which does not significantly cause further diffusion of the dopants, can be subsequently performed. FIG. 9C illustrates the situation after the second thermal annealing step. A skilled person will appreciate that further processes will follow, or can be performed beforehand, to complete the semiconductor device, such processes include, without being limited thereto, forming a field stop region and a drain region at the second surface of the semiconductor substrate 2, forming an insulation layer on the electrode structure 40 and first and second metallizations to provide electrical contact to the source and body regions 24, 23 and to the drain region 21, respectively.

The lateral width d1 of the first electrode portion 41 can be in a range from about 1 µm to about 25 µm. In some embodiments, d1 is in a range from about 5 µm to about 15 µm. Furthermore, the lateral width d2 of the second electrode portion 42 can be in a range from about 0.5 µm to about 15 µm. In some embodiments, d2 is in a range from about 2 µm to about 10 µm. The lateral width d2 is selected in consideration of the first thermal annealing process which is typically carried out at about 1000° C. to about 1200° C. for about 10 min to 500 min.

Processes of a method according to a further embodiment are illustrated in FIGS. 10A and 10B. On a semiconductor substrate 2, a dielectric layer 45 and an electrode structure 40 are formed, for example, by deposition and subsequent etching using a resist mask. Similar to the embodiment of FIGS. 9A to 9C, the electrode structure 40 is used as implantation mask to form body regions 23 and source regions 24 by implanting first and second dopants with a first thermal anneal therebetween. The source regions 23 are laterally spaced from each other to such an extent that they do not merge at its outermost boundaries. The resulting structure is illustrated in FIG. 10A.

In a subsequent process, an implantation mask 53 is formed on the electrode structure 40 to cover at least source regions 24. At selected locations, the implantation mask 53 has implantation openings 54 above the electrode structure 40 to allow implantation of a third dopant of the same conductivity type as the first dopant used to form the body regions 23. By this implantation, which is indicated in FIG. 10B, a depletable region 26 is formed between selected adjacent body regions 23. This method allows formation of laterally larger depletable regions 26 in comparison to the method of FIGS. 9A to 9C. Accordingly, the electrode structure 40 can include second electrode portions 42 having a significantly larger width d2 in comparison to the width d2 of the second electrode portions 42 illustrated in FIG. 9A. Depletable regions 26 can also be formed before formation of body and/or source regions 23, 24. In this case, the thermal annealing process used for diffusing the body and/or the source regions can be used which reduced the overall thermal budget of the device.

To reduce the manufacturing cost, the implantation process for forming the depletable regions 26 can also be used to form desired doping regions at other locations of the semiconductor device. For example, the implantation process can be performed together with implantations used to form lowly doped regions, for example, at the periphery of the semiconductor device 1. If the implantation dose would be too high for the formation of the depletable regions 26, additional resist regions or bars could be used to cover portions of the implantation openings 54 which lead to a reduction of the amount of the implanted third dopant 55 at this location.

The methods are cost effective since they do not require additional masks. In fact, existing implantation processes, particularly existing implantation masks, can be easily modified to allow formation of the depletable region. A processless adjustment of the size and/or the doping concentration of the depletable region 26 can therefore also be provided. For example, by appropriately selecting the width d2 of the second electrode portion 42 the lateral extent of the depletable region 26 can be set as illustrated in FIGS. 9A to 9C. This also applies to the implantation mask 53 as described in connection with FIGS. 10A and 10B. An increased depletable region 26 exhibits a larger switchable capacitance and hence allows better adjustment of the switching behaviour of the semiconductor device.

The threshold at which the capacitance switches can be adjusted by appropriately selecting the doping concentration, or more particularly the doping dose, of the depletable region. This allows tailoring the switching behaviour and reduction of switching losses. The doping dose is therefore appropriately selected in consideration of the switching threshold.

Further improvement of the switching behaviour can be obtained by a reduced outdiffusion, at least in sections, of the body regions 23. It would also be possible to reduce the threshold at which the semiconductor device becomes conductive, i.e. the threshold at which an inversion channel is formed is reduced by reducing the doping concentration of the body regions 23.

In connection with FIGS. 11A and 11B, a section of a semiconductor device 1 according to a further embodiment, which includes compensation regions, will be described. FIG. 11A illustrates a cross-section view of a portion of the semiconductor device while FIG. 11B illustrates a plan view on an electrode structure of the semiconductor device.

Similar to the above described embodiments, the semiconductor device 1 includes a semiconductor substrate 2 having a first surface 11 and a second surface 12. The semiconductor substrate 2 includes, in this order, an $n^+$-doped drain region 21, an n-doped field stop region 30 and an $n^-$-doped drift region 22. Embedded in the drift region 22 there are formed p-doped body regions 23 and $n^+$-doped source regions 24. Furthermore, p-doped compensation regions 25, which are in electrical connection with the body regions 23, are formed as columns below the body regions 23. At selected areas, depletable regions 26 are formed between adjacent body regions 23 at the first surface 11. Source and body regions 24, 23 are electrically connected to a first metallization 35 wherein $p^+$-doped body contact regions 29 are provided to form a good ohmic contact between first metallization 35 and body regions 23.

A dielectric layer 45 having a first portion 45a and a second portion 45b are formed on the first surface 11. An insulation layer 28 insulates an electrode structure 40 having first and second electrode portions 41, 42 from the semiconductor substrate 2.

In this embodiment, depletable regions 26 are formed in selected area of the semiconductor device only. For example, the electrode structure 40 can include a region having a bar-shaped design similar to that of FIG. 1A in a given region so that depletable regions are formed which allow switching of the gate-drain capacitance. In other regions of the semiconductor device 1, the electrode structure 40 can include a hexagonal design so that no depletable regions 26 are formed there. The relative proportion between the area including depletable-regions and the area without depletable regions can be selected according to specific needs. FIG. 11B depicts the different layout in different areas.

Embodiments as described herein form a semiconductor device which includes a semiconductor substrate and a field effect transistor structure. The field effect transistor structure includes a source region of a first conductivity type, a first body region of a second conductivity type, a drain region of the first conductivity type, a gate electrode structure and a gate insulating layer. The gate insulating layer is arranged between the gate electrode structure and the body region. The gate electrode structure and the drain region form a capacitor structure which includes a gate-drain capacitance which can be increased dynamically with increasing a reverse voltage applied between the source and drain regions so that the course of the gate-drain capacitance depending on the reverse voltage exhibits at least one local maximum or at least one plateau.

The semiconductor device can further include a depletable region of the second conductivity type in electrical connection with the body region, wherein the depletable region is arranged next to portions of the gate electrode and at the first surface. The depletable region forms together with portions of the gate electrode structure a capacitor structure with a capacitance that increases with the increasing reverse voltage due to the action of the expanding space-charge region formed between the drift region and the depletable region.

The semiconductor device can further include a second body region of the second conductivity type, with the depletable region connecting the first and second body regions.

The semiconductor device can also be described to include a semiconductor substrate having a drift region of a first conductivity type. The semiconductor device further includes a field effect transistor structure, which has a gate electrode, a gate insulating layer and a body region of a second conductivity type, wherein the body region is formed in the semiconductor substrate and forms a pn-junction with the drift region. The gate insulating layer is arranged between the body region and the gate electrode. The semiconductor device further includes a capacitor structure having a capacitor electrode, a capacitor insulating layer and a depletable region of the second conductivity type, wherein the depletable region is formed in the semiconductor substrate, forms a pn-junction with the drift region and is electrically connected to the body region of the field effect transistor structure. The capacitor insulating layer is arranged between the capacitor electrode and the depletable region, wherein the capacitor electrode is electrically connected to the gate electrode. The capacitor structure provides a switchable capacitance which can switches as a function of the reverse voltage applied to the semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for manufacturing a semiconductor device, comprising:
 providing a semiconductor substrate comprising a drift region of a first conductivity type;
 forming at least a first body region of a second conductivity type in the semiconductor substrate;
 forming at least a depletable region of the second conductivity type adjoining the first body region in the semiconductor substrate;
 forming at least a source region of the first conductivity type in the semiconductor substrate such that the first body region is arranged between the drift region and the source region;
 forming an insulation structure on the semiconductor substrate; and
 forming at least an electrode structure on the insulation structure such that the electrode structure being arranged at least in portions next to the first body region and at least in portions next to the depletable region.

2. The method of claim 1, further comprising forming a second body region of the second conductivity adjacent to the first body region, wherein the first and second body regions are formed by implanting a dopant of the second conductivity type.

3. The method of claim 2, comprising:
 forming the electrode structure before forming the first and second body regions; and
 using the electrode structure as implantation mask for implanting the dopant of the second conductivity type to form the first and second body regions in a self-aligned manner with respect to the electrode structure.

4. The method of claim 2, further comprising providing a further mask and implanting separately a dopant of the second conductivity type using the further mask as implantation mask to form the depletable region connecting the first and second doping regions.

5. The method of claim 3, further comprising performing at least one thermal annealing step after implanting the dopant of the second conductivity type, wherein the annealing step is performed such that the implanted dopant of the second conductivity is diffused so that the depletable region connecting first and second doping regions is formed.

6. The method of claim 5, wherein the electrode structure is formed to comprise at least a first electrode portion comprising a lateral width d1 and a second electrode portion comprising a lateral width d2, wherein the first and second electrode portions are electrically connected with each other, and wherein d1 is larger than d2.

7. The method of claim 5, comprising performing the process of forming the source region after the thermal annealing process and comprises implanting a dopant of the first conductivity type while using the electrode structure as implantation mask.

8. A method for manufacturing a semiconductor device, comprising:
 providing a semiconductor substrate comprising a drift region of a first conductivity type;
 forming an insulation structure on the semiconductor substrate;
 forming at least an electrode structure arranged on the insulation structure such that the electrode structure comprises at least an electrode portion comprising a lateral width d2;
 implanting a dopant of a second conductivity type into the drift region using the electrode portion as implantation mask such that a first doping region and a second doping region of the second conductivity type are formed, wherein the first and second doping regions are laterally spaced from each other;
 performing at least one thermal anneal for diffusing the implanted dopant to form a first and second body region; and
 wherein the lateral width d2 and the thermal anneal are selected such that the doping regions diffuses together and form a depletable region of the second conductivity type which connects the first and second body regions.

9. The method of claim 8, further comprising implanting a dopant of the first conductivity type after performing the thermal annealing process with the electrode structure being used as implantation mask to form a source region.

* * * * *